US012581813B2

(12) United States Patent
Li et al.

(10) Patent No.: US 12,581,813 B2
(45) Date of Patent: Mar. 17, 2026

(54) DISPLAY PANEL AND DISPLAY DEVICE

(71) Applicant: BEIJING XIAOMI MOBILE SOFTWARE CO., LTD., Beijing (CN)

(72) Inventors: Yan Li, Beijing (CN); Tsangchih Wu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 550 days.

(21) Appl. No.: 17/707,509

(22) Filed: Mar. 29, 2022

(65) Prior Publication Data

US 2023/0121056 A1 Apr. 20, 2023

(30) Foreign Application Priority Data

Oct. 20, 2021 (CN) .......................... 202111220331.2

(51) Int. Cl.
*H10K 59/131* (2023.01)
*H10K 59/121* (2023.01)
*H10K 102/00* (2023.01)

(52) U.S. Cl.
CPC ....... *H10K 59/131* (2023.02); *H10K 59/1213* (2023.02); *H10K 2102/311* (2023.02)

(58) Field of Classification Search
CPC ............. H10K 59/131; H10K 59/1213; H10K 2102/311; H10K 59/1315
See application file for complete search history.

(56) References Cited

U.S. PATENT DOCUMENTS

| | | | | |
|---|---|---|---|---|
| 9,472,137 | B2 * | 10/2016 | Ahn | G09G 3/3233 |
| 11,177,338 | B2 * | 11/2021 | Kim | H10K 59/131 |
| 11,417,718 | B2 * | 8/2022 | Wu | H10K 59/1315 |
| 2005/0029937 | A1 * | 2/2005 | Kim | H10K 59/131 |
| | | | | 313/506 |

(Continued)

FOREIGN PATENT DOCUMENTS

| | | | | | |
|---|---|---|---|---|---|
| CN | 1195786 | A | * | 10/1998 | ....... G02F 1/133512 |
| CN | 1498041 | A | * | 5/2004 | ......... H01L 27/3276 |

(Continued)

OTHER PUBLICATIONS

European Patent Application No. 22165576.4, Search and Opinion dated Sep. 12, 2022, 8 pages.

(Continued)

*Primary Examiner* — Mohammed Shamsuzzaman
(74) *Attorney, Agent, or Firm* — Cozen O'Connor

(57) ABSTRACT

A display panel includes: a substrate; and a first power line, a second power line and a plurality of pixels all located on one side of the substrate. Each of the pixels is coupled to the second power line and the first power line respectively. The first power line and the second power line each includes at least two metal layers successively stacked along a direction away from the substrate, and a first insulating layer located between each two adjacent metal layers of the at least two metal layers. Each two adjacent metal layers are coupled through a via hole passing through the first insulating layer, and an orthographic projection of a target metal layer of the at least two metal layers on the substrate covers orthographic projections of the metal layers excluding the target metal layer of the at least two metal layers on the substrate.

20 Claims, 8 Drawing Sheets

(56)     References Cited

U.S. PATENT DOCUMENTS

| | | | |
|---|---|---|---|
| 2018/0122890 A1* | 5/2018 | Park | H10K 59/1315 |
| 2019/0371876 A1* | 12/2019 | Kim | H10K 59/173 |
| 2021/0074792 A1* | 3/2021 | Ma | H10K 59/1216 |
| 2021/0183991 A1* | 6/2021 | Shin | H10K 59/1315 |

FOREIGN PATENT DOCUMENTS

| | | | | | |
|---|---|---|---|---|---|
| CN | 1577413 | A | * | 2/2005 | H01L 27/3276 |
| CN | 108376685 | A | * | 8/2018 | H01L 27/124 |
| CN | 109087922 | A | * | 12/2018 | H01L 23/5221 |
| CN | 209434190 | U | * | 9/2019 | H01L 27/1255 |
| CN | 111640774 | A | * | 9/2020 | H01L 27/3246 |
| CN | 109494243 | B | * | 3/2021 | H01L 27/3276 |
| CN | 112838106 | A | * | 5/2021 | G09G 3/006 |
| KR | 20080104875 | A | * | 12/2008 | H01L 37/124 |
| WO | WO 2021012095 | A1 | | 1/2021 | |
| WO | WO-2021227029 | A1 | * | 11/2021 | H01L 27/1255 |

OTHER PUBLICATIONS

Chinese Patent Application No. 202111220331.2, Office Action with English translation dated Jan. 21, 2026, 14 pages.

* cited by examiner

SD3
SD2
PLN1
GATE2
GATE1     GATE1     P1

PLN3
PLN2
SD1
ILD
GI2
GI1
BUFFER
01

01

VSS     A2     A1

VDD     D1     VDD     D1     VDD     D1 pixel 02     pixel 02     ......     pixel 02 pixel 02     pixel 02     ......     pixel 02

DISPLAY PANEL AND DISPLAY DEVICE

CROSS REFERENCE TO RELATED APPLICATION

This application is based on and claims priority to Chinese patent application No. 202111220331.2, filed on Oct. 20, 2021, the entire content of which is hereby incorporated into this application by reference.

BACKGROUND

Organic light-emitting diode (OLED) display panels are widely applied for various display devices due to advantages of self light-emitting, small thickness, light weight and high light-emitting efficiency. Impedance within the circuitry of OLED display panels can increase power consumption and reduce its life.

SUMMARY

The present disclosure relates to the field of display technologies, and more particularly to a display panel and a display device.

According to a first aspect, the present disclosure provides a display panel. The display panel includes:

a substrate; and a first power line, a second power line and a plurality of pixels all located on one side of the substrate; in which each of the pixels is coupled to the second power line and the first power line respectively, and is configured to emit light under driving of a first voltage supplied by the first power line and a second voltage supplied by the second power line;

in which, the first power line and the second power line each includes: at least two metal layers successively stacked along a direction away from the substrate, and a first insulating layer located between each two adjacent metal layers of the at least two metal layers, in which each two adjacent metal layers are coupled through a via hole passing through the first insulating layer, and an orthographic projection of a target metal layer of the at least two metal layers on the substrate covers orthographic projections of the metal layers excluding the target metal layer of the at least two metal layers on the substrate.

According to a second aspect, the present disclosure provides a display device. The display device includes a driving integrated circuit and a display panel;

in which the driving integrated circuit is coupled to a first power line and a second power line in the display panel, and the driving integrated circuit is configured to transmit a first voltage to the first power line and a second voltage to the second power line;

in which, the display panel includes:

a substrate; and a first power line, a second power line and a plurality of pixels all located on one side of the substrate; in which each of the pixels is coupled to the second power line and the first power line respectively, and is configured to emit light under driving of a first voltage supplied by the first power line and a second voltage supplied by the second power line;

in which, the first power line and the second power line each includes: at least two metal layers successively stacked along a direction away from the substrate, and a first insulating layer located between each two adjacent metal layers of the at least two metal layers, in which each two adjacent metal layers are coupled through a via hole passing through the first insulating layer, and an orthographic projection of a target metal layer of the at least two metal layers on the substrate covers orthographic projections of the metal layers excluding the target metal layer of the at least two metal layers on the substrate.

BRIEF DESCRIPTION OF THE DRAWINGS

In order to more clearly describe the technical solutions in embodiments of the present disclosure, the following briefly introduces the accompanying drawings required for describing the embodiments. Obviously, the accompanying drawings in the following description are only embodiments of the present disclosure. Other drawings can be obtained based on these drawings, for those skilled in the art, without inventive labor.

LISTING OF REFERENCE SIGNS

Figure 1:
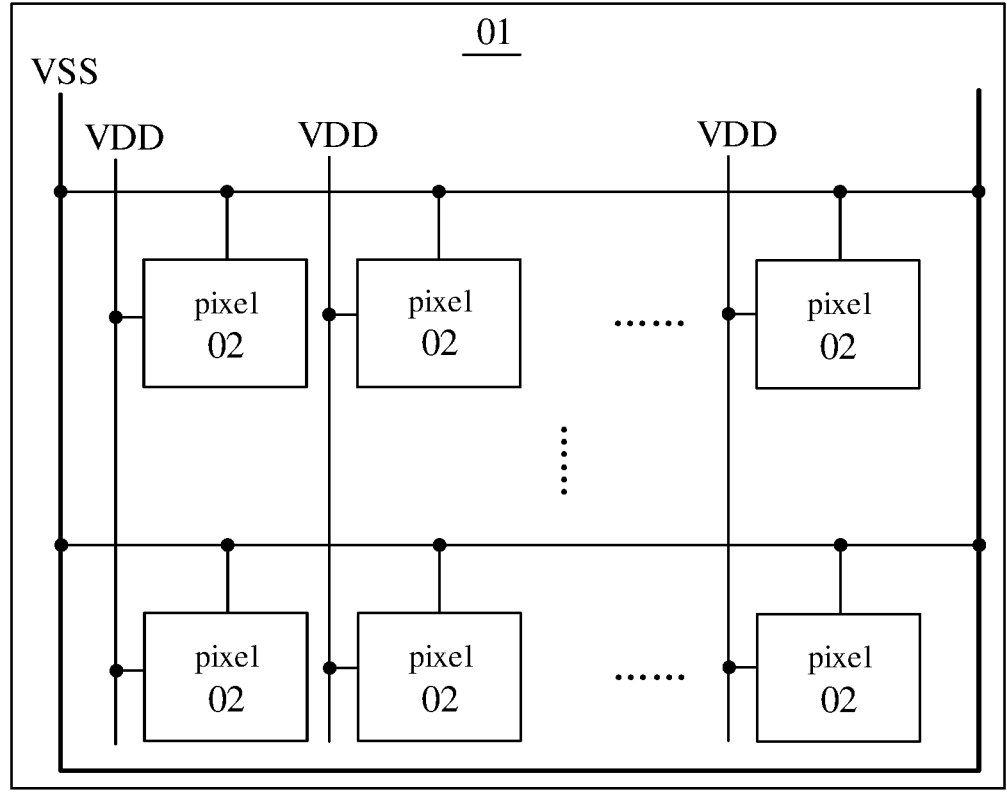
FIG. 1 is a schematic diagram illustrating a structure of a display panel according to an embodiment of the present disclosure.

00: display panel, 10: driving integrated circuit;

01: substrate, 02: pixel, 03: metal layer, 04: first insulating layer, 05: connection electrode, 06: second insulating layer, ILD: interlayer dielectric layer, 07: crack dam, 08: crack detection circuit, 09: blocking dam, k0: a via hole passing through the first insulating layer 04, k1: a via hole passing through the second insulating layer, EL: electroluminescent layer;

VDD: first power line, VSS: second power line, V1: reset power line, RE1: reset line, G1: gate line, D1: data line, EM: light-emitting control line, VGH third power line, VGL fourth power line;

021: pixel circuit, 022: light-emitting element, T0: driving transistor, T1: data writing transistor, T2: compensation transistor, T3: first reset transistor, T4: second reset transistor, T5: first light-emitting control transistor, T6: second light-emitting control transistor, C1: storage capacitor;

P1: active layer, GATE1: first gate metal layer, GATE2: second gate metal layer, SD1: first source-drain metal layer, SD2 second source-drain metal layer, SD3 third source-drain metal layer, BUFFER: buffer layer, GIL first gate insulating layer, GI2: second gate insulating layer, ILD interlayer dielectric layer, PLN1: first planarization layer, PLN2: second planarization layer, PLN3: third planarization layer, EOA: light-emitting control driving circuit, GOA: gate driving circuit, ESD: electro-static discharge element, FPC: flexible printed circuit, Fl: first fan-out region, F2: second fan-out region.

DETAILED DESCRIPTION

In order to make the purpose, technical solution and advantages of the present disclosure clearer, embodiments of the present disclosure will be further described in detail below in combination with the accompanying drawings.

The terms described in embodiments of the present disclosure are only for the purpose of describing the present disclosure and are not intended to limit the present disclosure. Unless otherwise defined, the technical terms or scientific terms used in embodiments of the present disclosure shall be a common meaning understood by those skilled in the art of the present disclosure. A "first", "second", "third" or similar words used in the embodiments of the present disclosure and the appended claims do not imply any order, quantity, or importance, but are configured only to distinguish different components. Similarly, "one", "a" and other similar words do not represent quantity limitation, but represents at least one. Unless otherwise stated, "including" or "comprising" and other similar words mean that the components or objects before "including" or "comprising" cover the components or objects and their equivalents listed after "including" or "comprising", not excluding other components or objects. Similar words such as "connected to" or "connected with" are not limited to physical or mechanical connections, and may include electrical connections, no matter direct or indirect. "Up", "down", "left" and "right" are only used to represent a relative position relationship. When an absolute position of a described object changes, the relative position relationship may also change accordingly. "And/or" means that there may be three relationships, for example, A and/or B may mean the following three situations: A alone, both A and B, and B alone. The character "/" generally indicates an "or" relationship between front and rear associated objects.

For OLED display panels, light-emitting elements in each pixel are current driven OLED devices, that is, the brightness of the pixel is determined by a driving current flowing through the light-emitting element. Generally, the larger the driving current, the lighter the brightness, while the smaller the driving current, the darker the brightness. A value of the driving current depends on a voltage difference between a driving voltage Vdd supplied by a VDD line coupled to the pixel and a pull-down voltage Vss supplied by a VSS line coupled to the pixel, namely, Vdd-Vss. Generally, the greater the voltage difference, the greater the driving current, while the smaller the voltage difference, the smaller the driving current. In addition, the VDD line and VSS line both are coupled to a driving integrated circuit (IC). The driving voltage Vdd transmitted to the pixel by the VDD line and the pull-down voltage Vss transmitted to the pixel by the VSS line are both from the driving IC. Due to an impedance of the VDD line, the driving voltage Vdd finally transmitted to the pixel by the VDD line is generally less than a voltage supplied to the VDD line by the driving IC, that is, there is a certain voltage drop across both ends of the VDD line. The greater the impedance of the VDD line, the greater the voltage drop across both ends of the VDD line, accordingly, the smaller the driving voltage Vdd transmitted to the pixel from the VDD line. That is, the more loss of the voltage supplied to the VDD line by the driving IC, the greater loss of the driving IC. Such is similar to the VSS line, and will not be repeated here.

Based on the above analysis, taking the VDD line as an example, in a case that the driving current is at a certain demand and the impedance of the VDD line is large, a large voltage is to be supplied to the VDD line by the driving IC, which leads to a large power consumption during operation of the driving IC, a large power consumption during displaying of the OLED display panel and poor endurance capacity of the OLED display panel. After testing, when the driving voltage Vdd supplied to the pixel is 4.6 volts (V) and the pull-down voltage Vss is $-3V$, that is, Vdd-Vss is that $4.6+3=7.6V$, the power consumption during use of the OLED display panel is about 1.72 watts (W) under testing conditions that a 6.7-inch OLED display panel displays 255 gray-scale white picture, a display brightness is 500 nit and a refresh rate is 60 Hz.

Embodiments of the present disclosure provide a display panel. Impedances of a VDD line and a VSS line in the display panel are small. In this way, loss during operation of the display panel is low, power consumption during use of the display panel is low, and endurance capacity of the display panel is improved.

FIG. 1 is a schematic diagram illustrating a structure of a display panel according to an embodiment of the present disclosure. As illustrated in FIG. 1, the display panel 00 includes a substrate 01, a first power line VDD (i.e., driving power line or VDD line), a second power line VSS (i.e., pull-down power line or VSS line) and a plurality of pixels 02 located on one side of the substrate 01. In some embodiments, the first power line VDD is couple to a high-level output terminal of a driving IC, and the second power line VSS is couple to a low-level output terminal of the driving IC.

Each pixel 02 is coupled to the first power line VDD and the second power line VSS respectively, and is configured to emit light under a first voltage (i.e., driving voltage) supplied by the first power line VDD and a second voltage (i.e., pull-down voltage) supplied by the second power line VSS. In other words, the first power line VDD transmits an output voltage of the high-level output terminal of the driving IC to the pixel 02, and the first voltage refers to a voltage transmitted to the pixel 02 through the first power line VDD. The second power line VSS transmits an output voltage of the low-level output terminal of the driving IC to the second power line VSS, and the second voltage refers to a voltage transmitted to the pixel 02 through the second power line VSS. Based on the above analysis, brightness of the pixel 02 is positively correlated with a voltage difference between the first voltage and the second voltage. That is, the greater the voltage difference, the lighter the brightness; the smaller the voltage difference, the darker the brightness.

Referring to FIG. 1, the display panel may include one second power line VSS and a plurality of first power lines VDD, and the plurality of pixels 02 included in the display panel may be arranged in an array. On this basis, the number of the first power lines VDD may be equal to the number of columns of the plurality of pixels 02, and pixels 02 located in the same column may be coupled to the same first power line VDD.

Figure 2:
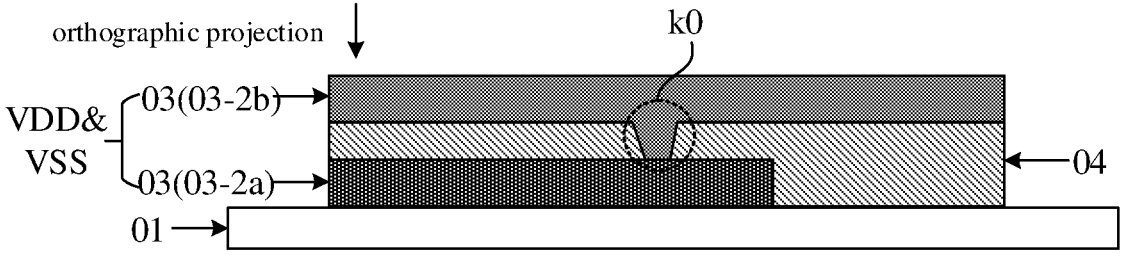
FIG. 2 is a cross-section schematic diagram illustrating a cross-section of a display panel according to an embodiment of the present disclosure.

On the basis of FIG. 1, FIG. 2 is a cross-section schematic diagram illustrating a cross-section of a display panel. Each of the first power line VDD and the second power line VSS described in embodiments of the present disclosure includes at least two metal layers 03 successively stacked along a direction away from the substrate 01, and a first insulating layer 04 located between each adjacent two metal layers 03. Each two adjacent metal layers 03 are coupled through a via hole k0 passing through the first insulating layer 04 (the first insulating layer 04 refers to the first insulating layer 04 located between two metal layers 03 to be coupled). An orthographic projection of a target metal layer 03, e.g., 03-2*b* of the at least two metal layers 03 on the substrate 01 covers orthographic projections of the metal layers 03, e.g., 03-2*a*, excluding the target metal layer 03 of the at least two metal layers 03 on the substrate 01.

For example, referring to FIG. 2, the first power line VDD and the second power line VSS shown therein each includes two metal layers 03 and the first insulating layer 04 located between the two metal layers 03. The two metal layers 03 are coupled through the via hole k0 passing through the first insulating layer 04. In the two metal layers 03, the orthographic projection of the metal layer 03 away from the substrate 01 on the substrate 01 covers the orthographic projection of the metal layer 03 close to the substrate 01 on the substrate 01. That is, the metal layer 03 away from the substrate 01 is the target metal layer 03.

Since the metal layers coupled in parallel may reduce an impedance of a signal line, and the larger an overlapping region between the two metal layers coupled in parallel may cause the impedance of the signal line smaller, the impedance of the first power line VDD and the impedance of the second power line VSS provided in the embodiment of the present disclosure are low. Therefore, combined with the above analysis, the voltage drop across both ends of the first power line VDD and the voltage drop across both ends of the second power line VSS are small, that is, the voltage loss of the first voltage and the voltage loss of the second voltage are small. Furthermore, in order to cause the pixel 02 reaching the certain brightness by driving, the voltages supplied to the first power line VDD and the second power line VSS by the driving IC may be relatively small. Thus, the power consumption during operation of the driving IC is low. Accordingly, the power consumption during use of the display panel is low and the endurance capacity is strong.

To sum up, the embodiment of the present disclosure provides the display panel. In the display panel, each of the first power line and the second power line coupled to the pixel includes the at least two metal layers successively stacked, each adjacent two metal layers are coupled to each other, and the positive projection of one metal layer of the at least two metal layers on the substrate covers the positive projections of the metal layers excluding the foregoing one metal layer of the at least two metal layers on the substrate. Since each of the first power line and the second power line is realized by multi-layer metal layers, an impedance of the first power line and an impedance of the second power line are relatively small. Accordingly, a voltage drop across both ends of the first power line and a voltage drop across both ends of the second power line are relatively small, that is, voltage loss of the first voltage and voltage loss of the second voltage are relatively low, which may effectively reduce the power consumption and the loss during the operation of the display panel.

Figure 3:
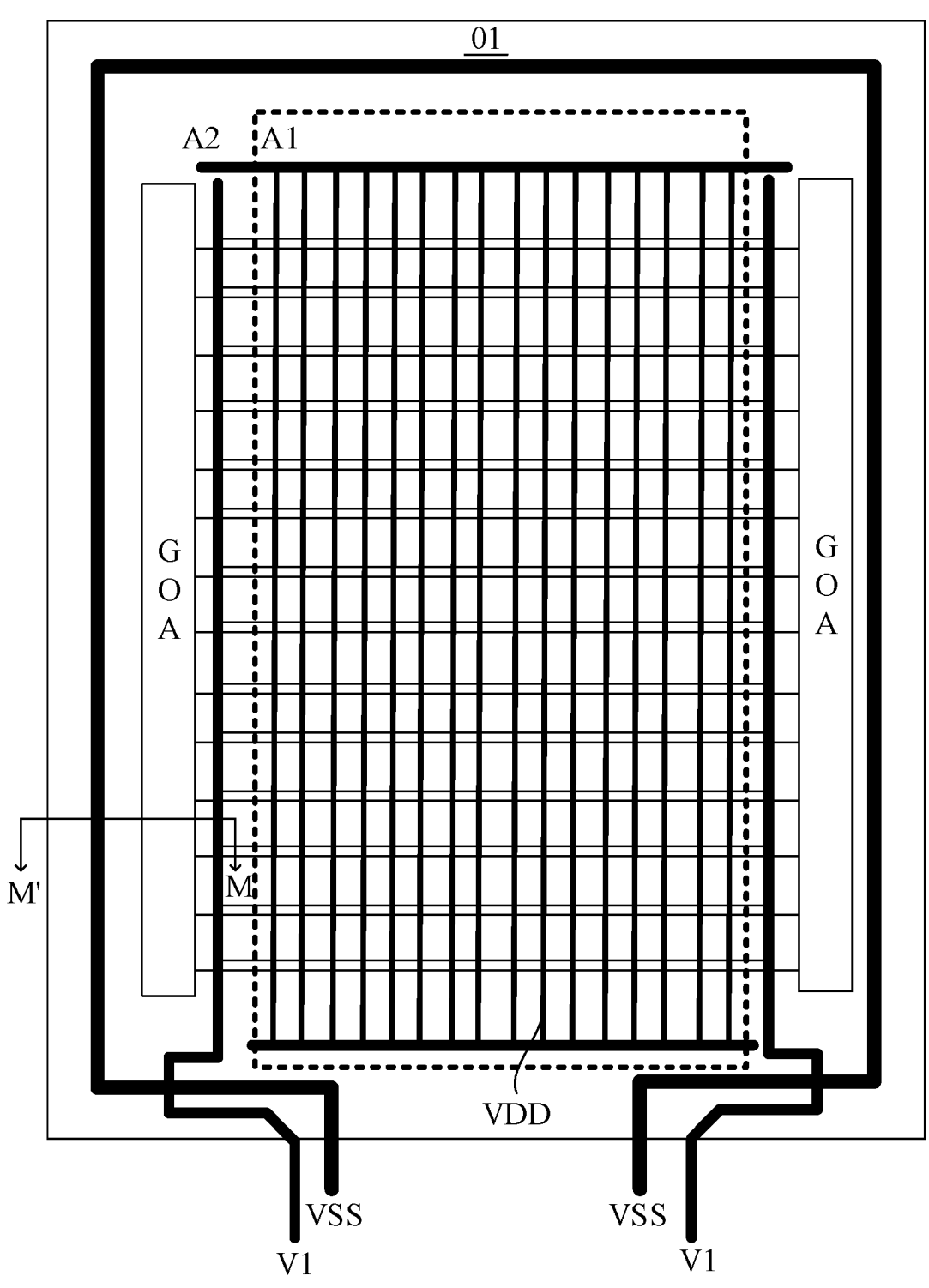
FIG. 3 is a schematic diagram illustrating a structure of a display panel according to another embodiment of the present disclosure.

FIG. 3 is a schematic diagram illustrating a structure of a display panel according to another embodiment of the present disclosure. As illustrated in FIG. 3, the substrate 01 may include a display region A1 and a peripheral region A2 surrounding the display region A1.

The plurality of first power lines VDD described in the embodiment of the present disclosure may be located in the display region A1, and the second power line VSS may be located in the surrounding region A2.

As a possible implementation, in the embodiment of the present disclosure, a number of the metal layers 03 included in the first power line VDD may be the same as a number of the metal layers 03 included in the second power line VSS.

Figure 4:
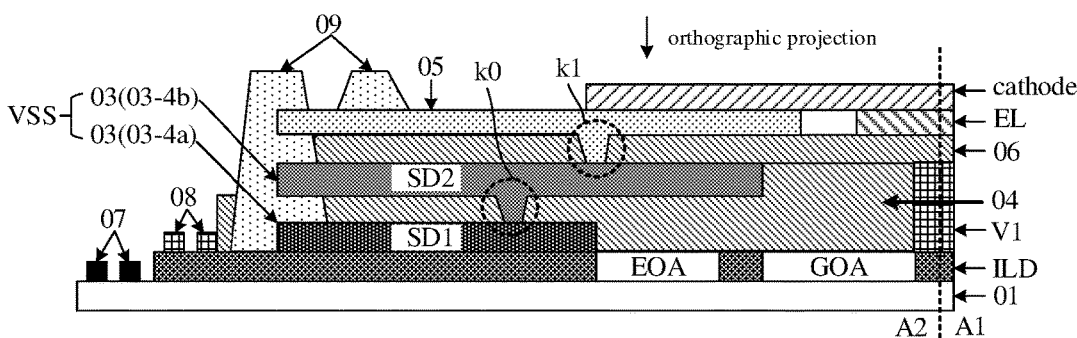
FIG. 4 is a cross-section schematic diagram illustrating a cross-section of a display panel according to another embodiment of the present disclosure.

For example, FIG. 4 illustrates a cross-sectional view of the display panel shown in FIG. 3 in an MM' direction. With reference to FIG. 2 and FIG. 4, each of the first power line VDD and the second power line VSS described in the embodiment of the application may include two metal layers 03. Accordingly, the display panel may include one layer of first insulating layer 04 located between the two metal layers 03.

Figure 5:
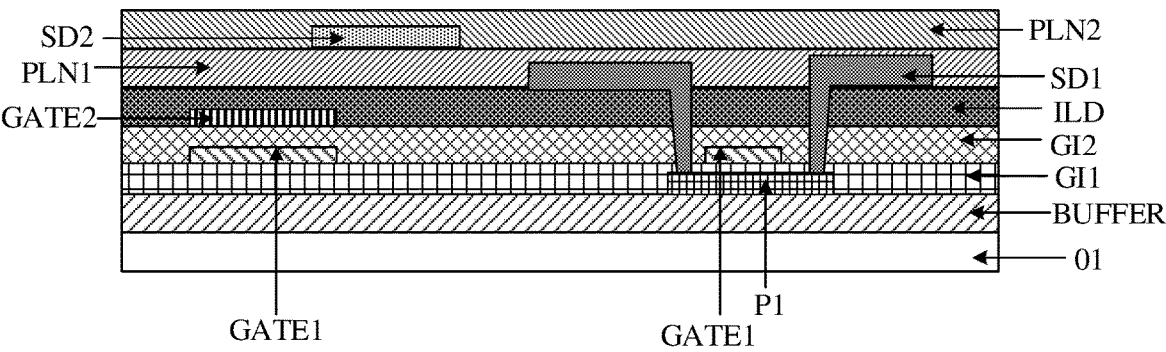
FIG. 5 is a cross-section schematic diagram illustrating a cross-section of a pixel according to an embodiment of the present disclosure.

On this basis, referring to a schematic diagram of a pixel illustrated in FIG. 5, the pixel 02 described in the embodiment of the present disclosure may include: an active layer P1, a first gate metal layer GATE1, a second gate metal layer GATE2, a first source-drain metal layer SD1 and a second source-drain metal layer SD2 successively stacked along a direction away from the substrate 01.

Combined with FIG. 4, the two metal layers 03, e.g., 03-4*a* and 03-4*b*, included in the second power line VSS may be located on same layers as the first source-drain metal layer SD1 and the second source-drain metal layer SD2 included in the pixel 02, respectively. For example, in the two metal layers 03 included in the second power line VSS, one metal layer 03, e.g., 03-4*a*, may be located on the same layer as the first source-drain metal layer SD1, and the other metal layer 03, e.g., 03-4*b*, may be located on the same layer as the second source-drain metal layer SD2. In this way, the second voltage may be supplied to the pixel 02 through the first source-drain metal layer SD1 and the second source-drain metal layer SD2.

The two metal layers 03 included in the first power line VDD may also be located on same layers as the first source-drain metal layer SD1 and the second source-drain metal layer SD2 included in the pixel 02, respectively. For example, in the two metal layers 03 included in the first power line VDD, one metal layer 03, e.g., 03-4*a*, may be located on the same layer as the first source-drain metal layer SD1, and the other metal layer 03, e.g., 03-4*b*, may be located on the same layer as the second source-drain metal layer SD2. In this way, the first voltage may also be supplied to the pixel 02 through the first source-drain metal layer SD1 and the second source-drain metal layer SD2.

In addition, in combination with a positional relationship between the first source-drain metal layer SD1 and the second source-drain metal layer SD2 shown in FIG. 5, in the two metal layers 03 shown in FIG. 4, the metal layer 03, e.g., 03-4*a*, on the same layer as the first source-drain metal layer SD1 is closer to the substrate 01 than the metal layer 03, e.g., 03-4*b*, on the same layer as the second source-drain metal layer SD2.

The same layer may refer to a layer structure formed by forming a film layer for forming a specific pattern by the same film forming process, and then patterning the film layer by one-time composition process using a same mask. Due to different specific patterns, the one-time composition process may include multiple times of exposure, development or etching processes. The specific patterns in the formed layer structure may be continuous or discontinuous. That is, multiple elements, components, structures and/or parts located on the "same layer" are composed of same material and formed by the same one-time composition process. Therefore, the two metal layers 03 included in the second power line VSS are located on the same layers as the first source-drain metal layer SD1 and the second source-drain metal layer SD2 included in the pixel 02, respectively, and the two metal layers 03 included in the first power line VDD are located on the same layers as the first source-drain metal layer SD1 and the second source-drain metal layer SD2 included in the pixel 02, respectively, which simplify a manufacturing process, save manufacturing cost and improve manufacturing efficiency.

It is noted that since the cross-sectional view illustrated in FIG. 4 is a cross-sectional view of the peripheral region A1 of the substrate 01, FIG. 4 illustrates the two metal layers 03 included in the second power line VSS.

As another possible implementation, in the embodiment of the present disclosure, the number of metal layers 03 included in the second power line VSS may be greater than the number of metal layers 03 included in the first power line VDD. That is, the number of metal layers 03 included in the second power line VSS may be different from the number of metal layers 03 included in the first power line VDD.

Figure 6:
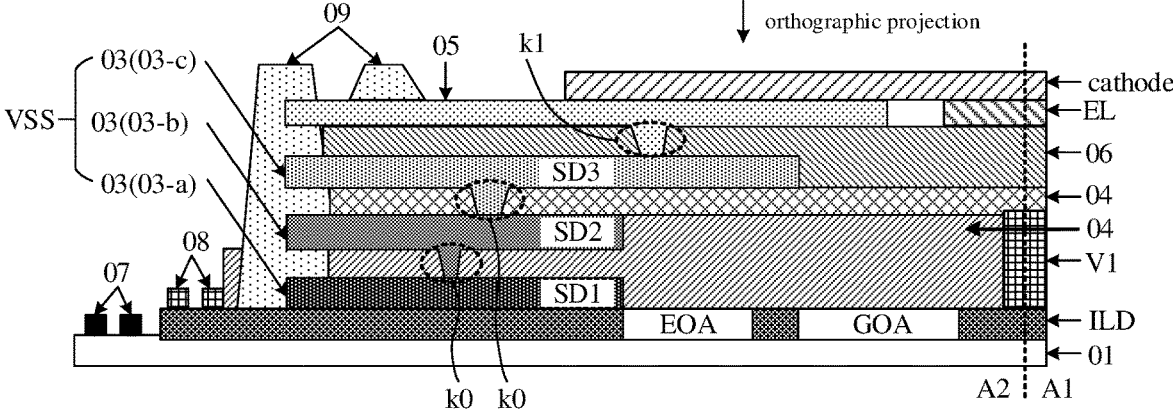
FIG. 6 is a cross-section schematic diagram illustrating a cross-section of a display panel according to yet another embodiment of the present disclosure.

As an example, FIG. 6 illustrates another cross-sectional view of the display panel illustrated in FIG. 3 in an MM' direction. In combination with FIG. 2 and FIG. 6, the first power line VDD described in the embodiment of the present disclosure may include two metal layers 03. The second power line VSS includes three metal layers 03, e.g., 03-6a, 03-6b, and 03-6c. Accordingly, referring to FIG. 6, the display panel may include two first insulating layers 04, one of which may be located between the first metal layer 03, e.g., 03-6a, and the second metal layer 03, e.g., 03-6b, of the three metal layers 03, and the other first insulating layer 04 may be located between the second metal layer 03, e.g., 03-6b, and the third metal layer 03, e.g., 03-6c. The first metal layer 03, e.g., 03-6a, refers to the metal layer 03 close to the substrate 01, the third metal layer 03, e.g., 03-6c, refers to the metal layer 03 away from the substrate 01, and the second metal layer 03, e.g., 03-6b, refers to the metal layer 03 between the first metal layer 03 and the second metal layer 03.

Figure 7:
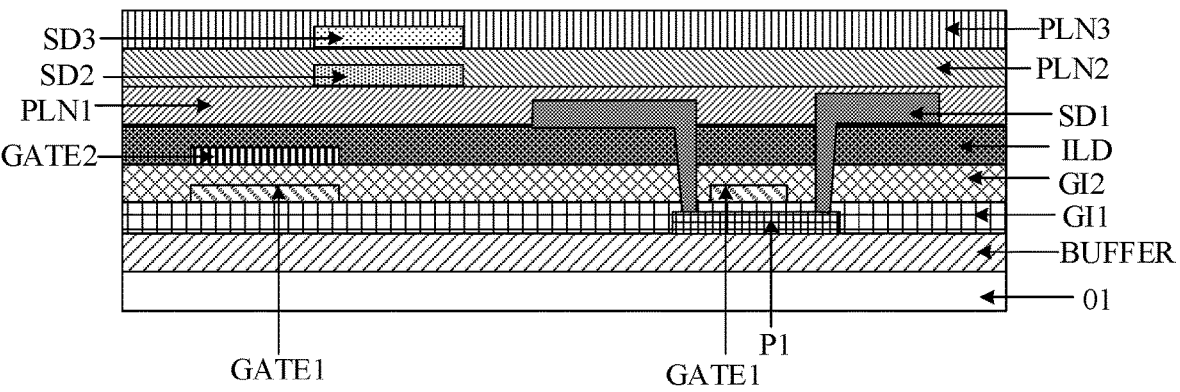
FIG. 7 is a cross-section schematic diagram illustrating a cross-section of a pixel according to another embodiment of the present disclosure.

On this basis, referring to a schematic diagram of a pixel illustrated in FIG. 7, the pixel 02 described in the embodiment of the present disclosure may include: an active layer P1, a first gate metal layer GATE1, a second gate metal layer GATE1, a first source-drain metal layer SD1, a second source-drain metal layer SD2 and a third source-drain metal layer SD3 successively stacked along a direction away from the substrate 01.

In combination with FIG. 4 and FIG. 6, the two metal layers 03 included in the first power line VDD may be located on the same layers as the first source-drain metal layer SD1 and the second source-drain metal layer SD2, respectively. For example, for the two metal layers 03 included in the first power line VDD, one metal layer 03 may be located on the same layer as the first source-drain metal layer SD1, and the other metal layer 03 may be located on the same layer as the second source-drain metal layer SD2. In this way, the first voltage may also be supplied to the pixel 02 through the first source-drain metal layer SD1 and the second source-drain metal layer SD2.

The three metal layers 03, e.g., 03-6a, 03-6b, and 03-6c, included in the second power line VSS may be located on the same layer as the first source-drain metal layer SD1, the second source-drain metal layer SD2 and the third source-drain metal layer SD3, respectively. For example, for the three metal layers 03 included in the second power line VSS, one metal layer 03, e.g., 03-6a, may be located on the same layer as the first source-drain metal layer SD1, another metal layer 03, e.g., 03-6b, may be located on the same layer as the second source-drain metal layer SD2, and yet another metal layer 03, e.g., 03-6c, may be located on the same layer as the third source-drain metal layer SD3. In this way, the second voltage may be supplied to the pixel 02 through the first source-drain metal layer SD1, the second source-drain metal layer SD2 and the third source-drain metal layer SD3.

In addition, in combination with a positional relationship of the first source-drain metal layer SD1, the second source-drain metal layer SD2 and the third source-drain metal layer SD3 illustrated in FIG. 7, in the three-layer metal layer 03 illustrated in FIG. 6, the metal layer 03, e.g., 03-6a, on the same layer as the first source-drain metal layer SD1 is closer to the substrate 01 than the metal layer 03, e.g., 03-6b, on the same layer as the second source-drain metal layer SD2, and the metal layer 03, e.g., 03-6b, on the same layer as the second source-drain metal layer SD2 is closer to the substrate 01 than the metal layer 03, e.g., 03-6c, on the same layer as the third source-drain metal layer SD3.

According to the above embodiment, the metal layers 03 included in the second power line VSS are located on the same layers as source-drain metal layers included in the pixel 02, respectively, and the metal layers 03 included in the first power line VDD are located on the same layers as respective source-drain metal layers included in the pixel 02, respectively, which may simplify a manufacturing process, save manufacturing cost and improve manufacturing efficiency.

In addition, it should be noted that compared with the previous implementation, in this implementation, since the display panel also includes the third source-drain metal layer SD3 and another first insulating layer 04 located between the third source-drain metal layer SD3 and the second source-drain metal layer SD2, the manufacturing process requires to add two more masks to manufacture the third source-drain metal layer SD3 and the another first insulating layer 04. Moreover, in this implementation mode, since the second power line VSS includes more metal layers 03, the impedance of the second power line VSS is further effectively reduced, and then loss of the voltage drop across both ends of the second power line VSS is further effectively reduced. The power consumption of the driving IC may be lower, and the power consumption of the display panel may be lower accordingly.

It should also be noted that since the cross-sectional view illustrated in FIG. 7 is a cross-sectional view of the peripheral region A1 of the substrate 01, FIG. 7 illustrates the three metal layers 03 included in the second power line VSS.

Figure 8:
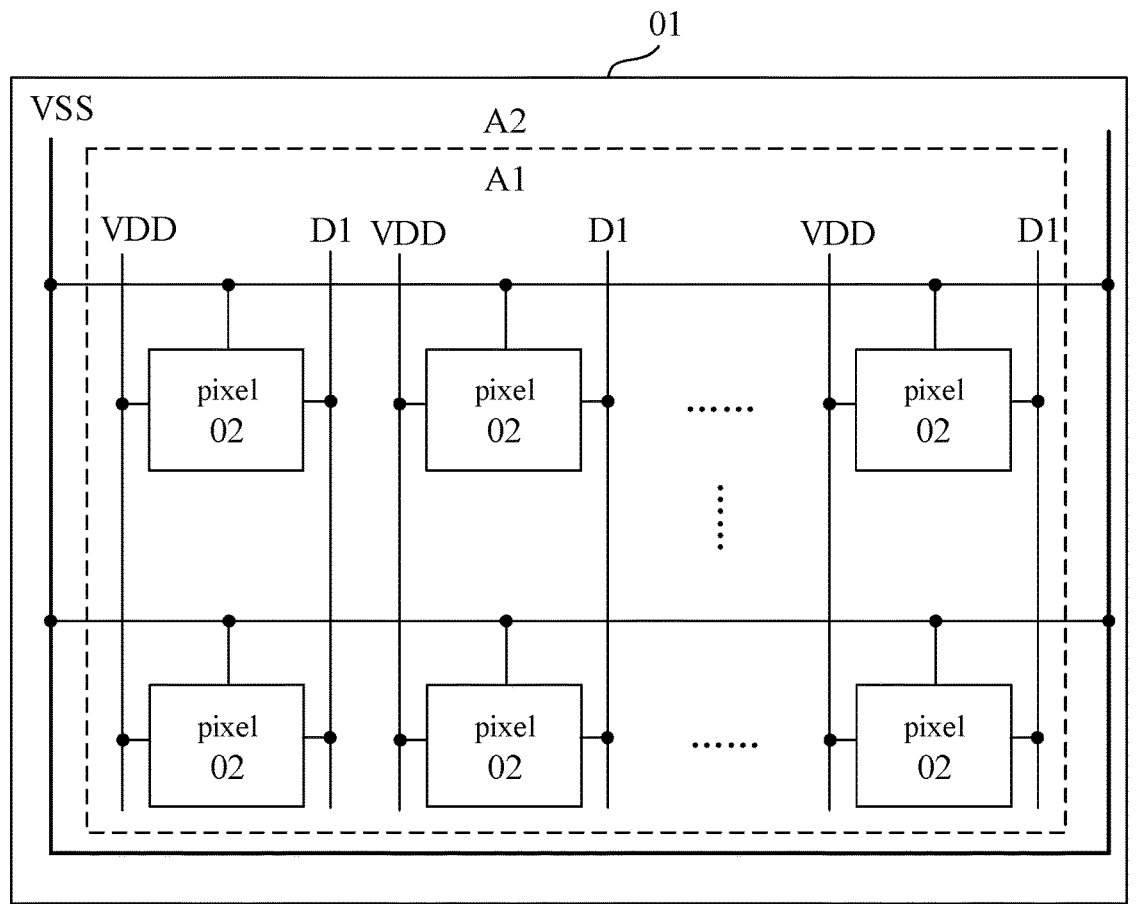
FIG. 8 is a schematic diagram illustrating a structure of a display panel according to another embodiment of the present disclosure.

FIG. 8 is a schematic diagram illustrating a structure of a display panel according to another embodiment of the present disclosure. As illustrated in FIG. 8, the display panel 00 may also include a data line D1 located on the one side of the substrate 01, and each pixel 02 is also coupled to the data line D1 and configured to emit light under driving of the first voltage, the second voltage and a data signal supplied by the data line D1. For example, referring to FIG. 8, the display panel may include a plurality of data lines D1, the number of the plurality of data lines D1 may be equal to the number of columns of the plurality of pixels 02, and the pixels 02 located in the same column may be coupled to the same first power line VDD. Referring to FIG. 8, the plurality of data lines D1 may be located in the display region A1.

On this basis, for the solution illustrated in FIG. 6, the data line D1 described in the embodiment of the present disclosure may be located on the same layer as the third source-drain metal layer SD3, that is, the data signal supplied by the data line D1 may be transmitted to the pixel 02 through the third source-drain metal layer SD3.

Since both the first power line VDD and the data line D1 are located in the display region, by setting the first power line VDD on the same layer as the first source-drain metal layer SD1 and the second source-drain metal layer SD2 included in the pixel 02, and setting the data line D2 on the same layer as the third source-drain metal layer SD3 included in the pixel 02, that is, setting the first voltage and data signal to be transmitted to the pixel 02 through different layers of source-drain metal layers, it may effectively prevent signal crosstalk between the first voltage and the data signal on a premise of reducing loss and power consumption.

For the solution illustrated in FIG. 4, the data line D1 described in the embodiment of the present disclosure may be located on the same layer as the second source-drain metal layer SD2, that is, the data signal supplied by the data line D1 may be transmitted to the pixel 02 through the second source-drain metal layer SD2.

Figure 9:
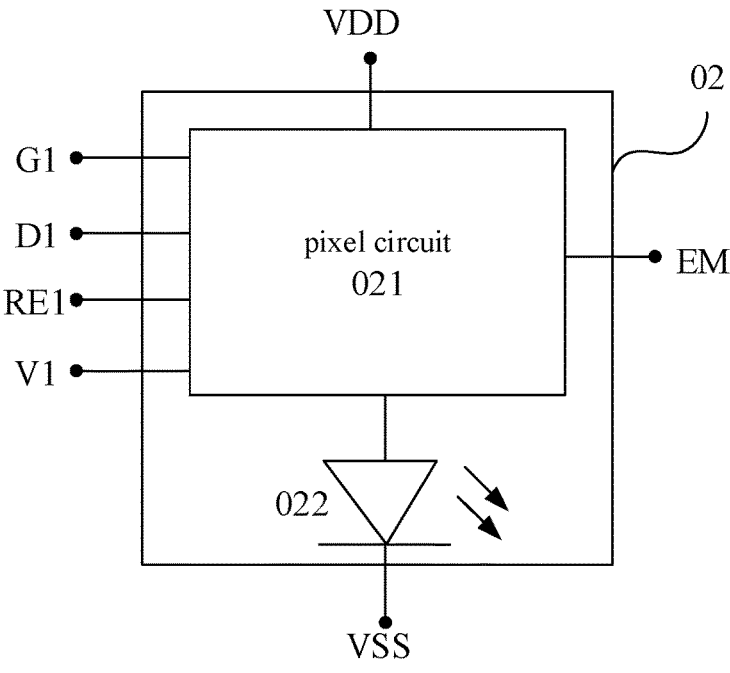
FIG. 9 is a schematic diagram illustrating a structure of a pixel according to an embodiment of the present disclosure.

FIG. 9 is a schematic diagram illustrating a structure of a pixel according to an embodiment of the present disclosure. As illustrated in FIG. 9, the pixel 02 may include a pixel circuit 021 and a light-emitting element 022.

The pixel circuit 021 may be coupled to the first power line VDD and a first pole of the light-emitting element 022, respectively. A second pole of the light-emitting element 022 may be coupled to the second power line VSS.

On this basis, the cross-sectional views shown in FIGS. 5 and 7 above are the structural diagram of the pixel circuit 021 included in the pixel 02. The pixel circuit 021 in the pixel 02 may include the active layer P1, the first gate metal layer GATE1, the second gate metal layer GATE2, the first source-drain metal layer SD1 and the second source-drain metal layer SD2 successively stacked along the direction away from the substrate 01. Alternatively, the pixel circuit 021 in the pixel 02 may include the active layer P1, the first gate metal layer GATE1, the second gate metal layer GATE2, the first source-drain metal layer SD1, the second source-drain metal layer SD2, and the third source-drain metal layer SD3 successively stacked along the direction away from the substrate 01.

In addition, in combination with FIGS. 4 and 6, the first pole of the light-emitting element 022 and the second pole of the light-emitting element 022 may be arranged along a direction away from the at least two metal layers 03. For example, the first pole of the light-emitting element 022 may be an anode, and the second pole of the light-emitting element 022 may be a cathode. The anode of the light-emitting element 022 may be located in the display region A1, and the cathode of the light-emitting element 022 may be located in the display region A1 and the surrounding region A2. Since FIGS. 4 and 6 both illustrate cross-sectional views of the peripheral region A2, the figures illustrate the cathode of the light-emitting element 022. FIGS. 4 and 6 also illustrate an electroluminescent layer (EL) between the anode and the cathode of the light-emitting element 022. Further, the display panel 00 may also include a connection electrode 05 and a second insulating layer 06.

The connection electrode 05 may be located on the same layer as the first pole (not shown in the figure) of the light-emitting element 022, the connection electrode 05 may be coupled to the second pole of the light-emitting element 021, and the second insulating layer 06 may be located between the connection electrode 05 and the at least two metal layers 03. On this basis, continuing to refer to FIGS. 4 and 6, for the at least two metal layers 03 included in the second power line VSS, the metal layer 03 close to the connection electrode 05 may be coupled to the connection electrode 05 through a via hole k1 passing through the second insulating layer 06.

In other words, for the structure illustrated in FIG. 4, the second voltage may be transmitted to another metal layer 03 on the same layer as the second source-drain metal layer SD2 through the via hole k0 passing through the first insulating layer 04 form the metal layer 03 on the same layer as the first source-drain metal layer SD1, then transmitted to the connection electrode 05 on the same layer as the anode of the light-emitting element 022 through the via hole k1 passing through the second insulating layer 06 from the another metal layer 03 on the same layer as the second source-drain metal layer SD2, finally transmitted to the cathode of the light-emitting element 022 through the connection electrode 05.

For the structure illustrated in FIG. 6, the second voltage may be transmitted to another metal layer 03 on the same layer as the second source-drain metal layer SD2 through the via hole k0 passing through the first insulating layer 04 from the metal layer 03 on the same layer as the first source-drain metal layer SD1, then transmitted to yet another metal layer 03 on the same layer as the third source-drain metal layer SD3 through the via hole k0 passing through another first insulating layer 04 from another metal layer 03 on the same layer as the second source-drain metal layer SD2, then transmitted to the connection electrode 05 located on the same layer as the anode of the light-emitting element 022 through yet another metal layer 03 located on the same layer as the third source-drain metal layer SD3, finally transmitted to the cathode of the light-emitting element 022 through the connection electrode 05.

Alternatively, referring to FIGS. 5 and 7, in addition to the above film layers, the pixel circuit 021 may also include a buffer layer BUFFER between the substrate 01 and the active layer P1, a first gate insulating layer GI1 between the active layer P1 and the first gate metal layer GATE1, and a second gate insulating layer GI2 between the first gate metal layer GATE1 and the second gate metal layer GATE2, an interlayer dielectric layer ILD between the second gate metal layer GATE2 and the first source-drain metal layer SD1, a first planarization layer PLN1 between the first source-drain metal layer SD1 and the second source-drain metal layer SD2, and a second planarization layer PLN2 between the second source-drain metal layer SD2 and the third source-drain metal layer SD3. Referring to FIG. 7, the pixel circuit 021 may also include a third planarization layer PLN3 located on one side of the third source-drain metal layer SD3 away from the substrate 01. The first planarization layer PLN1, the second planarization layer PLN2 and the third planarization layer PLN3 are the first insulating layer 04 described in the above embodiments. In addition, the display panel may also include a pixel dielectric layer PDL and a supporting layer PS located on a side of the anode of the light-emitting element 022 away from the substrate 01, and successively stacked.

For example, taking a structure illustrated in FIG. 5 as an example, Table 1 below illustrates alternative materials of respective film layers included in the pixel 02. Referring to Table 1, the substrate 01 may include: a first flexible material layer PI1, a first barrier layer Barrier1, the second flexible material layer PI2 and a second barrier layer Barrier 2 successively stacked and close to the buffer layer BUFFER. The materials of the first flexible material layer PI1 and the second flexible material layer PI2 are polyimide (Pi). The material of the first barrier layer Barrier1 is silicon dioxide (SiO2). The second barrier layer Barrier 2, the buffer layer BUFFER and the interlayer dielectric layer ILD each may include two layers of film layers successively stacked, one of which is made of SiO2 and the other of which is made of silicon nitride (SiNx). The material of the active layer P1 is silicon (Si). The material of the first gate insulating layer GI1 is SiO2. The material of the first gate metal layer GATE1 and the material of the second gate metal layer GATE2 are metal molybdenum (Mo). The material of the second gate insulating layer GI2 is SiNx. The material of the first source-drain metal layer SD1 and the material of the second source-drain metal layer SD2 both may be titanium/aluminum/titanium (Ti/Al/Ti). The material of the anode of the light-emitting element 022 may be indium-tin oxide (ITO)/silver/indium-tin oxide (ITO/Ag/ITO). The material of the first planarization layer PLN1, the material of the second planarization layer PLN2, the material of the pixel dielectric layer PDL and the material of the supporting layer PS may all be organic materials.

TABLE 1

| Pixel Layers and Materials | |
| --- | --- |
| Layer | Material |
| PI1 | Pi |
| Barrier 1 | SiO2 |
| PI2 | Pi |
| Barrier 2 | SiO2 |
| | SiNx |
| Buffer | SiNx |
| | SiO2 |
| Poly | Si |
| GI1 | SiO2 |
| GATE1 | Mo |
| GI2 | SiNx |
| GATE2 | Mo |
| ILD | SiO2 |
| | SiNx |
| SD1 | Ti/Al/Ti |
| PLN1 | organic material |
| SD2 | Ti/Al/Ti |
| PLN2 | organic material |
| Anode | ITO/Ag/ITO |
| PDL | organic material |
| PS | organic material |

Taking the structures illustrated in FIG. 4 and FIG. 5 as examples, combined with Table 1, in the embodiment of the present disclosure, the display panel may be manufactured through at least eleven mask processes. The eleven mask processes are configured for manufacturing: the active layer PI, the first gate metal layer GATE1, the second gate metal layer GATE2, the via hole k0, the first source-drain metal layer SD1, the via hole k1, the first planarization layer PLN1, the second source-drain metal layer SD2, the second planarization layer PLN2, the anode of light-emitting element 022, the pixel dielectric layer PDL and the supporting layer PS.

It should be noted that the materials of the above layers are only a representative description, which is not limited in the embodiment of the application.

Alternatively, referring to FIG. 9, in the embodiment of the present disclosure, the pixel 02 coupling to the data line D1 may refer to the pixel circuit 021 coupling to the data line D1. In addition, the pixel circuit 021 may also be coupled to a gate line G1, a reset line RE1, a reset power line V1 and a light-emitting control line EM respectively. The pixel circuit 021 may drive the light-emitting element 022 to emit light by supplying a driving current to the light-emitting element 022 under control of a first voltage, a data signal, a gate driving signal supplied by the gate line G1, a reset signal supplied by the reset line RE1, a reset power signal supplied by the reset power line V1 and a light-emitting control signal supplied by the light-emitting control line EM.

Figure 10:
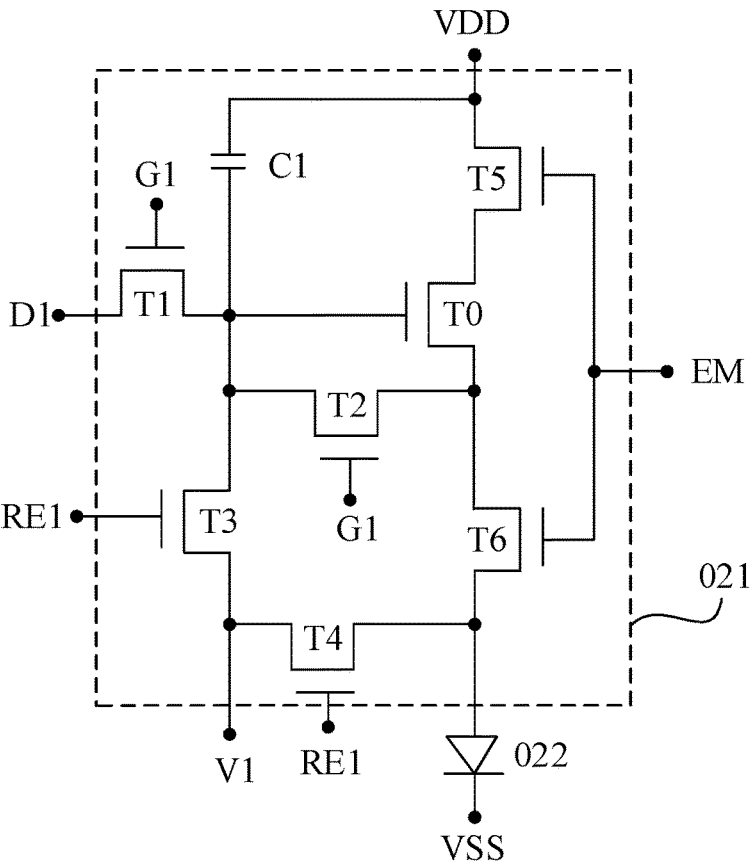
FIG. 10 is a schematic diagram illustrating a structure of a pixel according to another embodiment of the present disclosure.

Taking the structure illustrated in FIG. 9 as an example, FIG. 10 is a schematic diagram illustrating a structure of a pixel according to another embodiment of the present disclosure. As illustrated in FIG. 10, the pixel circuit 021 may include seven transistors, such as, a driving transistor T0, a data writing transistor T1, a compensation transistor T2, a first reset transistor T3, a second reset transistor T4, a first light-emitting control transistor T5 and a second light-emitting control transistor T6, and a storage capacitor C1.

A gate of the data writing transistor T1 and a gate of the compensation transistor T2 may be coupled to the gate line G1. A first pole of the data writing transistor T1 may be coupled to the data line D1, and a second pole of the data writing transistor T1 and a second pole of the compensation transistor T2 may both be coupled to a gate of the driving transistor T0. A first pole of the compensation transistor T2 may be coupled to a second pole of the driving transistor T0. When the gate line G1 supplies a gate driving signal with an effective electric potential, both the data writing transistor T1 and the compensation transistor T2 are turned on. At this time, the data signal supplied by the data line D1 may be supplied to the gate of the driving transistor T0 through the data writing transistor T1 to charge the gate of the driving transistor T0. The compensation transistor T2 may adjust an electric potential of the gate of the driving transistor T0 according to an electric potential of the second pole of the driving transistor T0 to compensate for a drift of a voltage threshold of the driving transistor T0, such that the driving current finally supplied to the light-emitting element 022 is independent of the voltage threshold of the driving transistor T0.

A gate of the first reset transistor T3 and a gate of the second reset transistor T4 may both be coupled to the reset line RE1. A first pole of the first reset transistor T3 and a first pole of the second reset transistor T4 may both be coupled to the reset power line V1. A second pole of the first reset transistor T3 may be coupled to the gate of the driving transistor T0, and a second pole of the second reset transistor T2 may be coupled to a first pole of the light-emitting element 022. When the reset line RE1 provides a reset signal with the effective electric potential, both the first reset transistor T3 and the second reset transistor T4 are turned on. At this time, the reset signal supplied by the reset power line V1 may be transmitted to the gate of the driving transistor T0 through the first reset transistor T3 to reset the gate of the driving transistor T0. The reset signal supplied by the reset power line V1 may be transmitted to the first pole of the light-emitting element 022 through the second reset transistor T4 to reset the first pole of the light-emitting element 022.

A gate of the first light-emitting control transistor T5 and a gate of the second light-emitting control transistor T6 may both be coupled to the light-emitting control line EM. A first pole of the first light-emitting control transistor T5 may be coupled to the first power line VDD, and a second pole of the first light-emitting control transistor T5 may be coupled to the first pole of the driving transistor T1. A first pole of the second light-emitting control transistor T6 may be coupled to the second pole of the driving transistor T1, and the second pole of the second light-emitting control transistor T6 may be coupled to the first pole of the light-emitting element 022. When the light-emitting control line EM supplies the light-emitting control signal with the effective electric potential, both the first light-emitting control transistor T5 and the second light-emitting control transistor T6 are turned on. At this time, the first voltage supplied by the first power line VDD may be transmitted to the first pole of the driving transistor T1 through the first light-emitting control transistor T5. The driving transistor T1 generates the driving current based on the first voltage and the electric potential at the gate of the driving transistor T1, and the driving current is transmitted to the light-emitting element 022 through the turned on second light-emitting control transistor T6, so that the light-emitting element 022 emits light. That is, a path may be formed between the first light-emitting control transistor T5, the driving transistor T0, the second light-emitting control transistor T7 and the light-emitting element 022.

One end of the storage capacitor C1 may be coupled to the gate of the driving transistor T0, and the other end of the storage capacitor C1 may be coupled to the first power line VDD. The storage capacitor C1 may adjust the electric potential of the gate of the driving transistor T0 based on the first voltage supplied by the first power line VDD through bootstrap of the storage capacitor C1.

In some embodiments, the pixel circuit 021 described in the embodiment of the present disclosure may be a 7T1C structure illustrated in FIG. 10 (i.e., seven transistors and one capacitor) or other structures, e.g., 6T1C.

In some embodiments, each transistor included in the pixel circuit 021 may be an N-type transistor. Accordingly, as described in the above embodiment, the effective electric potential may be a high potential. Alternatively, each transistor included in the pixel circuit may also be a P-type transistor. Accordingly, the effective electric potential may be a low potential.

Figure 11:
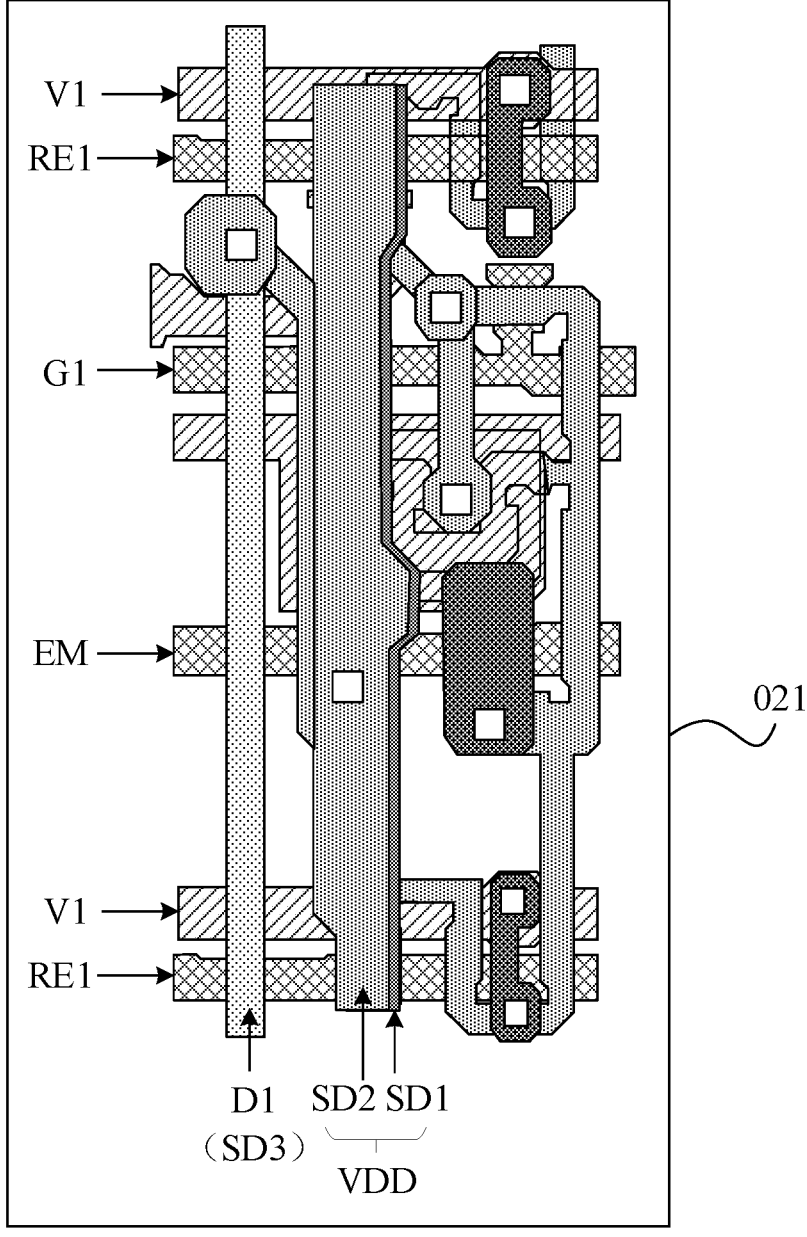
FIG. 11 is a schematic diagram illustrating a structure of a pixel circuit according to an embodiment of the present disclosure.

Taking the structures illustrated in FIGS. 6 and 10 as examples, FIG. 11 is a schematic diagram illustrating a structure of a pixel circuit according to an embodiment of the present disclosure. Referring to FIG. 11, the first power line VDD described in the embodiment of the present disclosure may include two metal layers 03 successively stacked, and the two metal layers 03 are located on the same layers as the first source-drain metal layer SD1 and the second source-drain metal layer SD2 respectively. The data line D1 is located on the same layer as the third source-drain metal layer SD3. In addition, FIG. 11 also indicates the reset power line V1, the reset line RE1, the gate line G1 and the light-emitting control line EM.

In some embodiments, still referring to FIGS. 4 to 7, the display panel described in the embodiment of the present disclosure may also include: an interlayer dielectric layer ILD between the substrate 01 and the at least two metal layers 03, a light-emitting driving circuit (EOA) and a gate driving circuit (GOA) located on the same layer as the interlayer dielectric layer ILD, and a plurality of crack dams 07, a plurality of crack detection circuits 08 and a plurality of blocking dams 09.

For example, FIGS. 4 and 6 illustrate two crack dams 07, two crack detection circuits 08, and two blocking dams 09.

FIGS. 4 and 6 also illustrate a cross-sectional view of the reset power line V1. On this basis, FIG. 3 also illustrates the reset power lines V1 and the GOA located in the peripheral region A2.

The plurality of crack dams 07, the plurality of crack detection circuits 08, the plurality of blocking dams 09, the at least two metal layers 03, the EOA, the GOA and the reset power line V1 are successively arranged along the direction close to the display region A1. Each crack dam 07 may be in direct contact with the substrate 01 and is configured to prevent water and oxygen in the air from immersing the display region A1 from cracks (also known as gaps) generated at an edge of the display panel. Each crack detection circuit 08 may be in contact with the interlayer dielectric layer ILD and configured to detect whether the crack is generated at the edge of the display panel. The GOA may be coupled to the gate line G1 and configured to supply the gate driving signal to the gate line G1. The EOA may be coupled to the light-emitting control line EM and configured to supply the light-emitting control signal to the light-emitting control line EM.

In the embodiment of the present disclosure, the target metal layer 03 may be located on the side of other metal layers away from the substrate 01. That is, for the multi-layer metal layers 03, the orthographic projection of the metal layer 03 furthest from the substrate 01 on the substrate 01 covers the orthographic projection of other metal layers 03 on the substrate 01.

In the peripheral region A2, elements between the metal layer 03 close to the substrate 01 and the substrate 01 may also include the GOA and the EOA both close to the display region A1, and the metal layer 03 away from the substrate 01 may also be coupled to the cathode of the light-emitting element 022 located in the display region A1 and the peripheral region A2 through the connection electrode 05. Therefore, the target metal layer 03 may be located on the side of other metal layers away from the substrate 01, which may avoid unnecessary crosstalk with the signals transmitted by the GOA and the signals transmitted by the EOA on the premise of effectively reducing the impedance of the second power line VSS, and facilitate effective coupling between the metal layer 03 and the cathode of the light-emitting element 022.

The display panel 00 described in the embodiment of the present disclosure may be a flexible organic light-emitting diode OLED display panel.

To sum up, the embodiment of the present disclosure provides the display panel. In the display panel, each of the first power line and the second power line coupled to the pixel includes the at least two metal layers successively stacked, each adjacent two metal layers are coupled to each other, and the positive projection of one metal layer of the at least two metal layers on the substrate covers the positive projections of the metal layers excluding the foregoing one metal layer of the at least two metal layers on the substrate. Since each of the first power line and the second power line is realized by multi-layer metal layers, an impedance of the first power line and an impedance of the second power line are relatively small. Accordingly, a voltage drop across both ends of the first power line and a voltage drop across both ends of the second power line are relatively small, that is, voltage loss of the first voltage and voltage loss of the second voltage are relatively low, which may effectively reduce the power consumption and the loss during the operation of the display panel.

Figure 12:
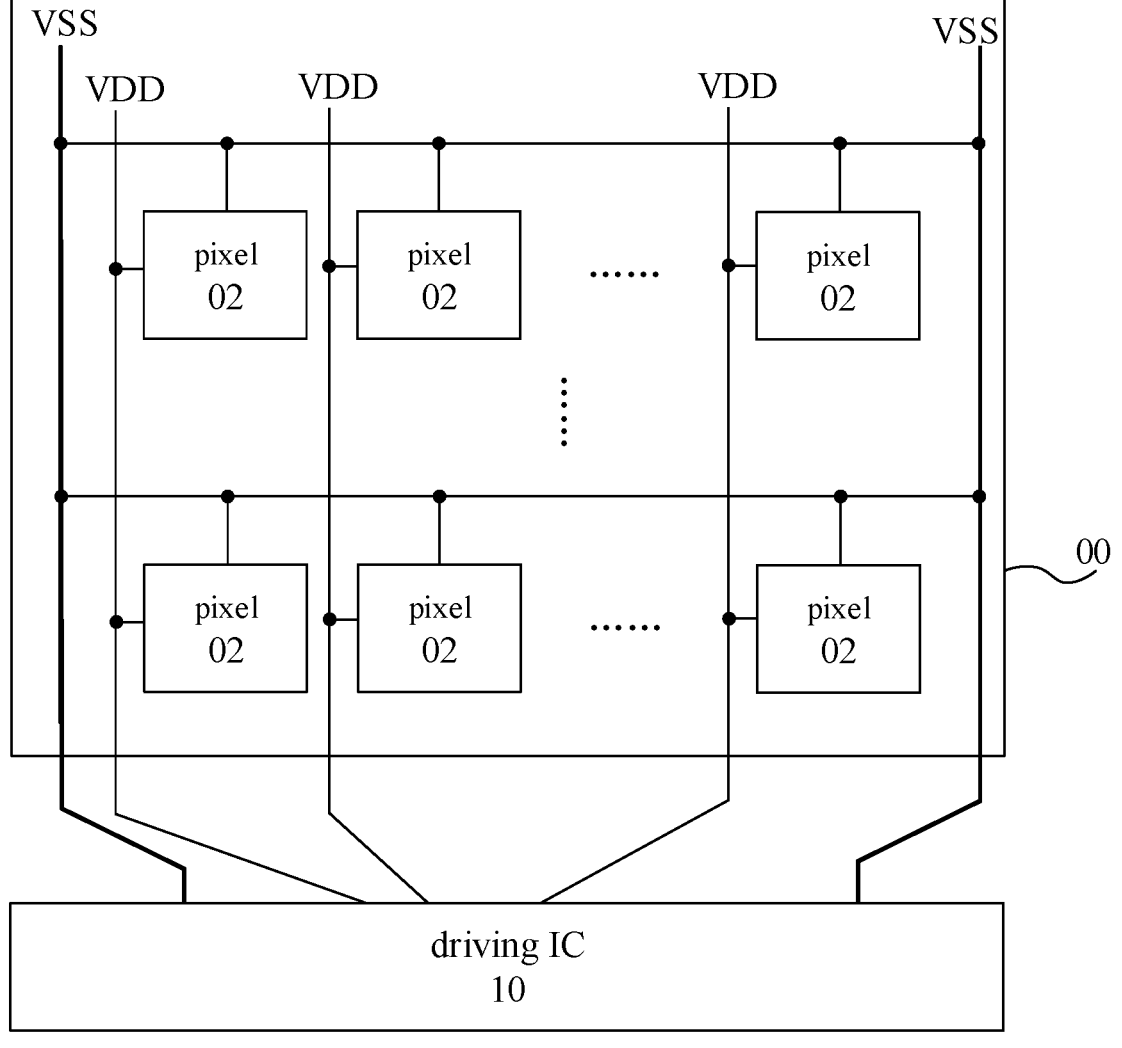
FIG. 12 is a schematic diagram illustrating a structure of a display device according to an embodiment of the present disclosure.

FIG. 12 is a schematic diagram illustrating a structure of a display device according to an embodiment of the present disclosure. As illustrated in FIG. 12, the display device includes a driving IC 10 and a display panel 00 as illustrated in any one of FIGS. 1 to 8.

The driving IC 10 is respectively coupled to the first power line VDD and the second power line VSS in the display panel 00, and configured to supply the drive voltage to the first power line VDD and supply the second voltage to the second power line VSS.

Figure 13:
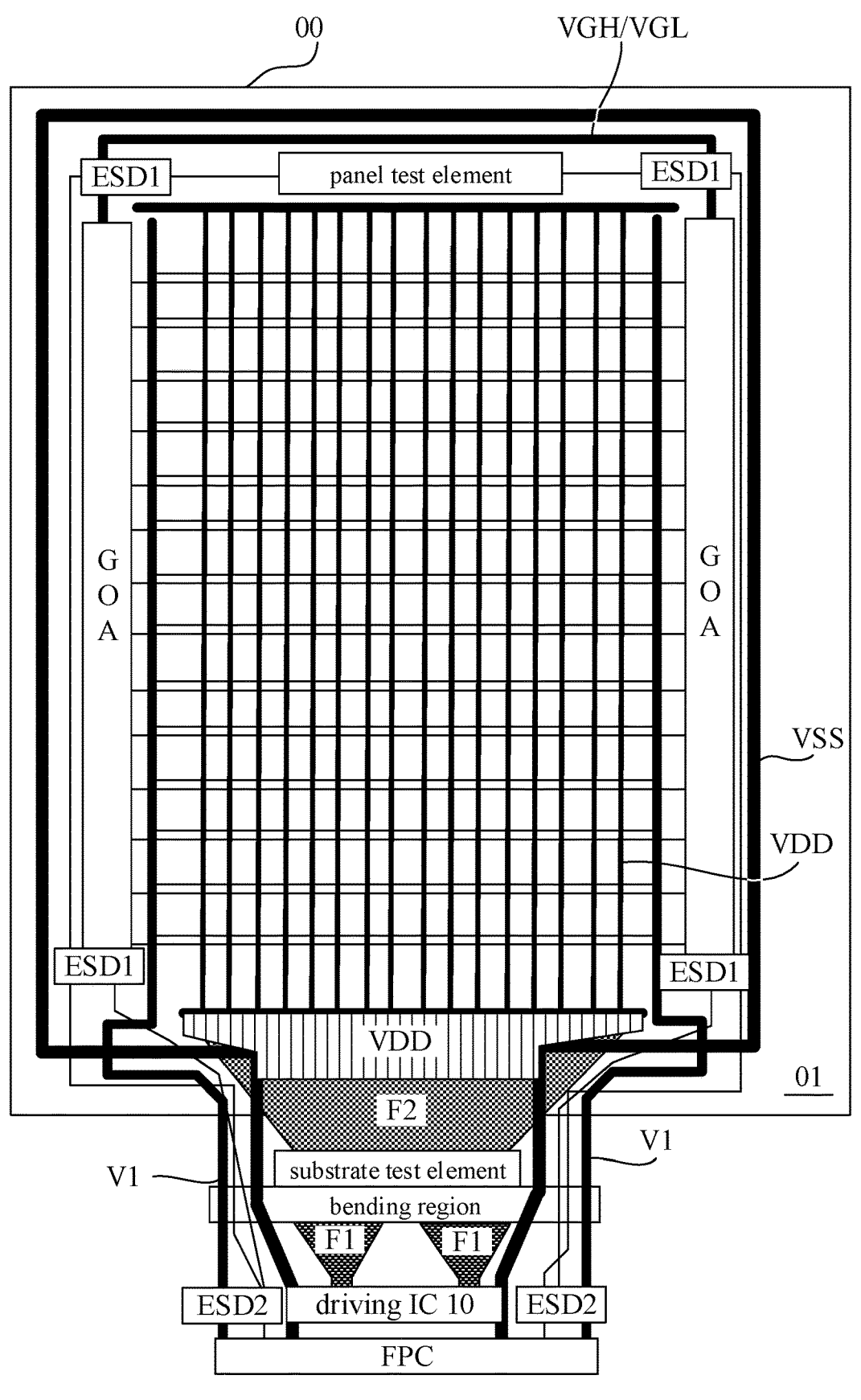
FIG. 13 is a schematic diagram illustrating a structure of a display device according to another embodiment of the present disclosure.

Taking the display panel 00 being a flexible display panel as an example, FIG. 13 is a schematic diagram illustrating a structure of a display device according to another embodiment of the present disclosure. Referring to FIG. 13, the display panel 00 in the display device may also include a panel test element, a plurality of first electro-static discharge (ESD) circuits ESD1, a third power line VGH and a fourth power line VGL all located on the substrate 01.

The GOA may be coupled to the third power line VGH and the fourth power line VGL, and operate in response to a third power line supplied by the third power line VGH and a fourth power line supplied by the fourth power line VGL. The panel test element may be coupled to each signal line located on the substrate 01 and configured to test each signal line before leaving the factory. Each ESD1 is coupled to respective signal lines located on the substrate 01 and is configured to discharge the static electricity generated on respective signal lines.

In addition, referring to FIG. 13, the display device may include a binding part located on one side of the substrate 01 (i.e., a bottom side as shown in the figure). The binding part may have a first fan-out region F1, a second fan-out region F2 and a bending region, and the first fan-out region F1, the bending region and the second fan-out region F2 are successively arranged along the direction close to the substrate 01. The binding part may also be supplied with a flexible printed circuit (FPC), a driving IC 10, a plurality of second electrostatic discharge circuits ESD2 and a substrate test element.

The signal line on the substrate 01 may be led out from the FPC and led into the substrate 01 from the driving IC 10 through the first fan-out region F1, the bending region and then through the second fan-out region F2. For example, the second power line VSS may be led out from the FPC and led into the substrate 01 through the driving IC 10, and may extend on the substrate 01 along a left frame, a right frame and an upper frame. The part located on the side of the bending region away from the substrate 01 may be bent from the bending region to a back side of the substrate 01. Each ESD2 is coupled to each signal line located in the binding part and is configured to discharge the static electricity generated on the signal line. The substrate test element is located between the bending region and the second fan-out region F2, and is configured to test the signal line in the binding part before leaving the factory.

The display device described in the embodiment of the present disclosure may be any product or component with display function, such as an OLED display device, an active-matrix organic light-emitting diode (AMOLED) display device, a mobile phone, a TV, a display, a laptop or a navigator.

The above are only some embodiments in embodiments of the present disclosure, and do not constitute the limitation of the present disclosure. Any modification, equivalent replacement, improvement, etc., made within the spirit and principle of embodiments of the present disclosure shall be included within the protection scope of embodiments of the present disclosure.

What is claimed is:

1. A display panel, comprising:

a substrate; and a first power line, a second power line and a plurality of pixels all located on one side of the substrate; wherein each of the pixels is coupled to the second power line and the first power line respectively, and is configured to emit light under driving of a first voltage supplied by the first power line and a second voltage supplied by the second power line;

wherein, the first power line and the second power line each comprise: at least two metal layers successively stacked along a direction away from the substrate, and a first insulating layer located between each two adjacent metal layers of the at least two metal layers, wherein each two adjacent metal layers are coupled through a via hole passing through the first insulating layer, and an orthographic projection of a target metal layer of the at least two metal layers on the substrate covers orthographic projections of the metal layers excluding the target metal layer of the at least two metal layers on the substrate;

wherein the at least two metal layers comprised in the first power line are located on the same layers as different source-drain metal layers comprised in each of the pixels, respectively, and the at least two metal layers comprised in the second power line are located on the same layers as of the different source-drain metal layers comprised in each of the pixels, respectively;

wherein the different source-drain metal layers comprised in each of the pixels comprise a first source-drain metal layer and a second source-drain metal layer different from the first source-drain metal layer.

2. The display panel according to claim 1, wherein the target metal layer is located on one side of another metal layer, and the one side of another metal layer is away from the substrate.

3. The display panel according to claim 1, wherein a number of the metal layers comprised in the first power line is the same as a number of the metal layers comprised in the second power line.

4. The display panel according to claim 3, wherein the first power line and the second power line each comprises two metal layers.

5. The display panel according to claim 4, wherein each of the pixels further comprises an active layer, a first gate metal layer, a second gate metal layer, wherein the active layer, the first gate metal layer, the second gate metal layer, the first source-drain metal layer and the second source-drain metal layer are successively stacked along a direction away from the substrate;

wherein the two metal layers comprised in the first power line are respectively located on same layers as the first source-drain metal layer and the second source-drain metal layer; and the two metal layers comprised in the second power line are respectively located on same layers as the first source-drain metal layer and the second source-drain metal layer.

6. The display panel according to claim 1, wherein a number of the metal layers comprised in the second power line is greater than a number of the metal layers comprised in the first power line.

7. The display panel according to claim 6, wherein the first power line comprises two layers of the metal layer; the second power line comprises three layers of the metal layer.

8. The display panel according to claim 7, wherein each of the pixels comprise an active layer, a first gate metal layer, a second gate metal layer, a first source-drain metal layer, a second source-drain metal layer and a third source-drain metal layer successively stacked along a direction away from the substrate;

wherein the two metal layers comprised in the first power line are respectively located on same layers as the first source-drain metal layer and the second source-drain metal layer;

the three metal layers comprised in the second power line are respectively located on same layers as the first source-drain metal layer, the second source-drain metal layer and the third source-drain metal layer.

9. The display panel according to claim 8, further comprising: a data line located on the one side of the substrate, and each pixel is coupled to the data line and used to emit light under driving of the first voltage, the second voltage and a data signal supplied by the data line;

wherein the data line is located on a same layer as the third source-drain metal layer.

10. The display panel according to claim 1, wherein each pixel comprises a pixel circuit and a light-emitting element, wherein the pixel circuit is respectively coupled to the first power line and a first pole of the light-emitting element, a second pole of the light-emitting element is coupled to the second power line, and the first pole and the second pole of the light-emitting element are successively arranged along a direction away from the at least two metal layers;

the display panel further comprises a connection electrode and a second insulating layer, wherein the connection electrode and the first pole of the light-emitting element are located on a same layer, and the connection electrode is coupled to the second pole of the light-emitting element, the second insulating layer is located between the connection electrode and the at least two metal layers;

for the at least two metal layers comprised in the second power line, a metal layer close to the connection electrode is coupled to the connection electrode through a via hole passing through the second insulating layer.

11. The display panel according to claim 1, wherein the display panel is a flexible organic light-emitting diode (OLED) display panel.

12. The display panel according to claim 1, wherein the substrate has a display region and a peripheral region surrounding the display region;

wherein the first power line is located in the display region, and the second power line is located in the peripheral region.

13. A display device, comprising a driving integrated circuit and a display panel;

wherein the driving integrated circuit is coupled to a first power line and a second power line in the display panel, and the driving integrated circuit is configured to transmit a first voltage to the first power line and a second voltage to the second power line;

wherein the display panel includes a substrate and a first power line, a second power line and a plurality of pixels all located on one side of the substrate;

wherein each of the pixels is coupled to the second power line and the first power line respectively, and is configured to emit light under driving of a first voltage supplied by the first power line and a second voltage supplied by the second power line;

wherein, the first power line and the second power line each comprises: at least two metal layers successively stacked along a direction away from the substrate, and a first insulating layer located between each two adjacent metal layers of the at least two metal layers, wherein each two adjacent metal layers are coupled through a via hole passing through the first insulating layer, and an orthographic projection of a target metal layer of the at least two metal layers on the substrate covers orthographic projections of the metal layers excluding the target metal layer of the at least two metal layers on the substrate;

wherein the at least two metal layers comprised in the first power line are located on the same layers as different source-drain metal layers comprised in each of the pixels, respectively, and the at least two metal layers comprised in the second power line are located on the same layers as of the different source-drain metal layers comprised in each of the pixels, respectively;

wherein the different source-drain metal layers comprised in each of the pixels comprise a first source-drain metal layer and a second source-drain metal layer different from the first source-drain metal layer.

14. The display device according to claim 13, wherein the target metal layer is located on one side of another metal layer, and the one side of another metal layer is away from the substrate.

15. The display device according to claim 13, wherein a number of the metal layers comprised in the first power line is the same as a number of the metal layers comprised in the second power line.

16. The display device according to claim 15, wherein the first power line and the second power line each comprises two metal layers.

17. The display device according to claim 16, wherein each of the pixels further comprises an active layer, a first gate metal layer, a second gate metal layer, wherein the active layer, the first gate metal layer, the second gate metal layer, the first source-drain metal layer and the second source-drain metal layer are successively stacked along a direction away from the substrate;

wherein the two metal layers comprised in the first power line are respectively located on same layers as the first source-drain metal layer and the second source-drain metal layer; and the two metal layers comprised in the second power line are respectively located on same layers as the first source-drain metal layer and the second source-drain metal layer.

18. The display device according to claim 13, wherein a number of the metal layers comprised in the second power line is greater than a number of the metal layers comprised in the first power line.

19. The display device according to claim 18, wherein the first power line comprises two layers of the metal layer; the second power line comprises three layers of the metal layer.

20. The display device according to claim 19, wherein each of the pixels comprise an active layer, a first gate metal layer, a second gate metal layer, a first source-drain metal layer, a second source-drain metal layer and a third source-drain metal layer successively stacked along a direction away from the substrate;

wherein the two metal layers comprised in the first power line are respectively located on same layers as the first source-drain metal layer and the second source-drain metal layer;

the three metal layers comprised in the second power line are respectively located on same layers as the first source-drain metal layer, the second source-drain metal layer and the third source-drain metal layer.

* * * * *